(12) United States Patent
Mizushima et al.

(10) Patent No.: US 11,829,600 B2
(45) Date of Patent: Nov. 28, 2023

(54) STORAGE SYSTEM AND DATA PROCESSING METHOD USING DATA COMPRESSION

(71) Applicant: Hitachi, Ltd., Tokyo (JP)

(72) Inventors: Nagamasa Mizushima, Tokyo (JP); Kentaro Shimada, Tokyo (JP)

(73) Assignee: HITACHI, LTD., Tokyo (JP)

( * ) Notice: Subject to any disclaimer, the term of this patent is extended or adjusted under 35 U.S.C. 154(b) by 71 days.

(21) Appl. No.: 17/689,078

(22) Filed: Mar. 8, 2022

(65) Prior Publication Data

US 2023/0132037 A1    Apr. 27, 2023

(30) Foreign Application Priority Data

Oct. 26, 2021    (JP) .................... 2021-174391

(51) Int. Cl.
*G06F 3/06* (2006.01)
(52) U.S. Cl.
CPC ............ *G06F 3/0608* (2013.01); *G06F 3/064* (2013.01); *G06F 3/0673* (2013.01)
(58) Field of Classification Search
None
See application file for complete search history.

(56) References Cited

U.S. PATENT DOCUMENTS

| | | | | |
|---|---|---|---|---|
| 5,999,272 A * | 12/1999 | Dow | ..................... | G06F 3/1285 358/1.14 |
| 6,348,881 B1 * | 2/2002 | Buer | ................... | H03M 7/3084 375/240 |
| 7,079,051 B2 * | 7/2006 | Storer | ...................... | H03M 7/30 341/51 |
| 10,346,043 B2 | 7/2019 | Golden et al. | | |
| 10,664,165 B1 * | 5/2020 | Faibish | .................. | G06F 3/0638 |
| 10,715,176 B1 * | 7/2020 | Singh | ....................... | G06F 17/18 |
| 10,817,190 B1 * | 10/2020 | Pohlack | ................ | G06F 3/0608 |
| 2008/0050025 A1 * | 2/2008 | Bashyam | ............. | H04N 19/172 382/233 |
| 2013/0166861 A1 * | 6/2013 | Takano | ................... | G06F 3/064 711/161 |
| 2014/0143517 A1 * | 5/2014 | Jin | .......................... | G06F 3/067 711/171 |

(Continued)

FOREIGN PATENT DOCUMENTS

CN    107925418 A    *    4/2018    ............... G06F 3/06

*Primary Examiner* — Christopher D Birkhimer
(74) *Attorney, Agent, or Firm* — Volpe Koenig

(57) ABSTRACT

A storage system includes an interface and a data compression system configured to compress reception data from the interface before the data is stored in a storage device. The data compression system is configured to compress the reception data using a first compression algorithm to generate first compressed data, use the number of appearances of each of predetermined code categories included in the first compressed data to estimate a decompression time when a second compression algorithm is used, select a second compression method including compression using the second compression algorithm when the decompression time is equal to or less than a threshold value, and select a first compression method that does not include the compression using the second compression algorithm when the decompression time is greater than the threshold value.

11 Claims, 14 Drawing Sheets

(56) References Cited

U.S. PATENT DOCUMENTS

2014/0223030 A1* 8/2014 Bhaskar .............. H03M 7/3088
709/247
2018/0095674 A1* 4/2018 Alameldeen ............ G06F 3/064
2019/0132480 A1* 5/2019 Hiramoto ................. H04N 1/41
2021/0036714 A1* 2/2021 Martin ................ H03M 7/6064

* cited by examiner

FIG. 3

| CODE | MATCHING LENGTH L | DISTANCE J | DECOMPRESSION PROCESSING UNIT PRICE Wi | NUMBER OF APPEARANCES Xi |
|---|---|---|---|---|
| LITERAL | — | — | 2 | 10859 |
| MATCH | ≤17 | ≤256 | 6 | 1135 |
|  |  | ≥257 | 8 | 351 |
|  | ≥18 | ≤256 | 8 | 276 |
|  |  | ≥257 | 10 | 164 |
| REP 0~3 | ≤17 | — | 6 | 127 |
|  | ≥18 | — | 8 | 11 |

STORAGE SYSTEM AND DATA PROCESSING METHOD USING DATA COMPRESSION

CLAIM OF PRIORITY

The present application claims priority from Japanese patent application JP 2021-174391 filed on Oct. 26, 2021, the content of which is hereby incorporated by reference into this application.

BACKGROUND OF THE INVENTION

1. Field of the Invention

The present invention relates to data compression in a storage system.

2. Description of the Related Art

In a storage system, a technique for compressing data is attracting attention as an important technique for reducing a cost (bit cost) per unit capacity of the system. In particular, instead of a hard disk drive (HDD) used as a storage device in the related art, a semiconductor drive (solid state drive: SSD) including a flash memory excellent in high-speed performance as a medium has been widely used in recent years. Data compression technique has attracted great attention as a technique for reducing a bit cost of a storage system mounted with an SSD.

On the other hand, in the storage system, performance of storing data, that is, write performance of writing data to the storage system is important, and performance of extracting stored data, that is, read performance of reading data from the storage system is also very important. When the data is compressed at the time of storing the data, the write performance is naturally influenced. Further, since data is stored in a compressed state, it is necessary to restore (decompress) the compressed data at the time of extracting the data, and the read performance is also influenced.

Various variations have been devised for a calculation method for compressing data. There is a lossless compression method such as a Lempel-Ziv (LZ) method or a Huffman code, and a lossy compression method such as JPEG or MPEG used for an image or sound. In the storage system, since it is required to accurately extract the data same as the stored data, the lossless compression method is used.

In these compression methods, a ratio of a size of compressed data to a size of original data, that is, a compression ratio (a value obtained by dividing the size of the compressed data by the size of the original data) varies depending on data and algorithms. For the same data, the compression ratio differs depending on each algorithm, but even with the same algorithm, if the data is different, the compression ratio is different. In the following description, a fact that the compression ratio is large may be expressed as "poor", a fact that the compression ratio becomes large may be expressed as "deteriorating", a fact that the compression ratio is small may be expressed as "good", and a fact that the compression ratio becomes small may be expressed as "improving".

In addition to the compression ratio, a calculation processing amount required for compression and a calculation processing amount required for decompression also change. Therefore, a time required for compression (compression time) and a time required for decompression (decompression time) also change when calculation processing resources such as software processing by a CPU and a circuit for compression and decompression by hardware are given. An influence on the write performance of the storage system depends on a compression time, and an influence on the read performance depends on a decompression time.

When decompression performance is observed based on an amount of output data per unit time of decompressed data, since a data size after decompression is increased as the compression ratio is better, the decompression performance is improved. Therefore, data having a good compression ratio has high decompression performance, and the read performance of the system can be improved.

As described above, when the system prepares and selects a plurality of compression methods in order to compress write data, the more the compression methods with good compression ratio are selected, the larger a calculation amount during decompression and the longer the decompression time, but for data having a sufficiently good compression ratio, there are few compressed data inputs to be calculated, and therefore there is a possibility that a decompression speed (decompression performance) observed based on decompressed data output is maintained high. However, for data having a poor compression ratio, there are many compressed data inputs to be calculated, and therefore there is a possibility that the decompression speed (decompression performance) observed based on the decompressed data output is hard to be maintained high, and that the read performance of the system is influenced.

U.S. Pat. No. 10,346,043 discloses a technique of preparing a plurality of compression methods for compressing write data, predicting a data decompression time based on a past data decompression history having similar attributes such as an application type, and switching the compression method. According to this technique, the compression method can be switched so as to improve read performance of a system.

In the technique of U.S. Pat. No. 10,346,043, the compression method is selected by predicting decompression performance (decompression time) using similarity of the attributes such as application type. However, in the application type that processes data having a large variation in the decompression time, prediction accuracy of the decompression time of current write data may decrease with respect to a past decompression history.

For example, when a large amount of data having a short decompression time has been decompressed in the past among data belonging to the application type, there is a high probability that a compression method having a good compression ratio is selected for the current write data that is determined to be a similar type. Thereafter, when a large amount of data having a long decompression time is read from these data, the read performance of a storage system may be adversely influenced.

In order to avoid this influence, a method for selecting a compression method with a short decompression time (generally, a method with a poor compression ratio) without selecting a compression method having a good compression ratio is required for write data estimated to have a long decompression time regardless of the similarity of attributes and the past decompression history. In addition, a method for correctly estimating the decompression time is required.

The invention has been made in view of the above circumstances, and an object of the invention is to prevent read performance of a storage system from being adversely influenced when data is compressed and stored in a storage system.

SUMMARY OF THE INVENTION

Typical examples of the invention disclosed in the present application will be briefly described as follows.

A storage system according to a typical example of the invention includes an interface and a data compression system configured to compress reception data from the interface before the data is stored in a storage device. The data compression system is configured to compress the reception data using a first compression algorithm to generate first compressed data, use the number of appearances of each of predetermined code categories included in the first compressed data to estimate a decompression time when a second compression algorithm is used, select a second compression method including compression using the second compression algorithm when the decompression time is equal to or less than a threshold value, and select a first compression method that does not include the compression using the second compression algorithm when the decompression time is greater than the threshold value.

According to an aspect of the invention, it is possible to prevent read performance of the storage system from being adversely influenced when data is compressed and stored in the storage system.

BRIEF DESCRIPTION OF THE DRAWINGS

FIG. 3 shows an example of a collection result of statistics of the number of appearances of codes constituting dictionary compression data.

DESCRIPTION OF THE PREFERRED EMBODIMENTS

Figure 1A:
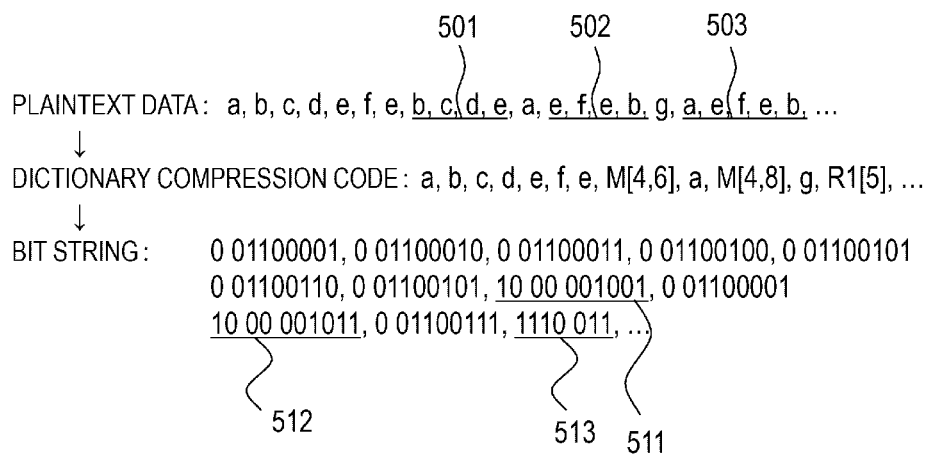
FIG. 1A shows an example of processing contents of dictionary compression.

Hereinafter, some embodiments will be described with reference to the drawings. First, a data compression system that compresses data in a storage system will be described. The data compression system can execute data compression by a plurality of data compression methods, and outputs compressed data obtained by compressing plaintext data that is input by a selected compression method. The data compression system further decompresses the input compressed data and outputs original (uncompressed) plaintext data (decompressed data).

When decompression performance is observed based on an amount of data per unit time of the decompressed data, if the compression ratio is good (small), a size of the decompressed data increases according to the compression ratio, so that the decompression performance increases. Therefore, data having a good compression ratio has high decompression performance, and it is possible to improve read performance of the storage system.

When a plurality of compression algorithms are prepared and to be selected, a compression algorithm having a good (small) compression ratio often has a long decompression time, but if the compression ratio is sufficiently good (a numerical value is small), a decompression speed (decompression performance) observed based on decompressed data can be maintained high. However, when the compression ratio is poor (large), there is a possibility that the decompression speed (decompression performance) observed based on the decompressed data is hard to be maintained high, and that the read performance of the storage system is adversely influenced.

When a compression method to be used is selected from a plurality of compression methods in order to reduce an influence on the read performance by using a relation between the compression ratio and the decompression time, the compression method to be selected can be determined if a decompression time of data compressed by using a compression algorithm having a relatively long decompression time can be estimated.

One compression method may be divided into a first half and a second half. Compared to the compression ratio and the decompression time when only the first half (first compression method) is applied, the compression ratio and the decompression time when both the first half and the second half (second compression method) are applied are better, and the decompression time is longer.

An example of such a compression method is a Lempel-Ziv-Markov chain-Algorithm (LZMA). In LZMA, a first half is configured with improved type dictionary compression (also referred to as LZ method), and a second half is configured with entropy encoding. Decompression of LZMA-compressed data requires a long time since a calculation amount of decoding of the entropy encoding executed first is added to subsequent plaintext decompression (restoring plaintext data from a dictionary compression code).

In addition, there is a compression method called LZ4. LZ4 is configured only with dictionary compression (first compression method). A decompression time of LZ4-compressed data is shorter than that of the LZMA-compressed data since a calculation amount is only for the plaintext decompression. That is, LZ4 has a decompression speed higher than that of LZMA. However, since LZ4 does not execute entropy coding, a compression ratio thereof is relatively worse than that of LZMA.

As described above, if the compression ratio of data is good (the numerical value is small), the decompression speed increases in accordance with the compression ratio even when the entropy encoding of the second half is executed, and therefore, even when LZMA is selected, the read performance of the system is not greatly influenced. On the other hand, if the compression ratio is poor (large), a time taken for decoding of the entropy encoding in the second half cannot be canceled out, and the read performance of the system may deteriorate.

FIG. 1A shows an example of processing contents of the improved type dictionary compression in the first half of LZMA. In this dictionary compression, it is sequentially checked whether the same character string appears again in a character string stream of the plaintext data. When a certain character string consecutively matches L characters J characters before the first character of this character string, the character string is converted into a copy code. There are two types of copy codes, that is, a Match code and a Rep code.

As the Match code, this character string is converted into M[L, J]. "M" represents the Match code, L represents the number of characters of a matching character string, and J represents a starting position of the matching character string. The Rep code is converted into Rn[L] by omitting J when a value of J is recently used. Here, n is a value from 0 to 3, and n=0 when the value of J is used immediately before, n=1 when the value of J is used two times before, n=2 when the value of J is used three times before, and n=3 when the value of J is used four times before. Since the Rep code requires a small amount of information, the Rep code has a compression effect higher than that of the Match code.

For example, a character string 501 with four characters "b, c, d, e" consecutively matches four characters six characters before the first character "b" thereof. In this case, the character string 501 is converted into M[4, 6], which is a Match code. Similarly, a character string 502 with four characters "e, f, e, b" consecutively matches four characters eight characters before the first character "e" thereof. In this case, the character string 502 is converted into M[4, 8], which is a Match code.

A character string 503 with five characters "a, e, f, e, b" consecutively matches five characters six characters before the first character "a" thereof. In this case, since the value "6" of J is a value used in a copy code two before, the character string 503 is converted into R1[5], which is a Rep code.

Figure 1B:
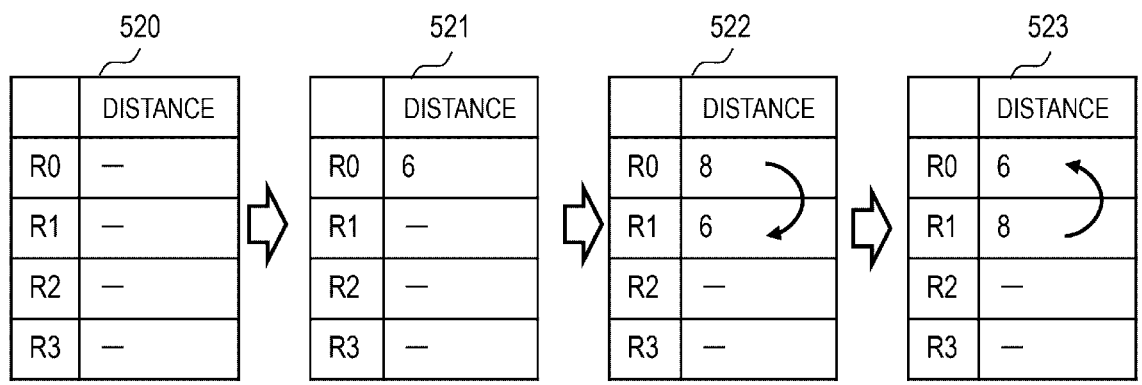
FIG. 1B shows changes in states of tables for managing a history of values of a distance J.

FIG. 1B shows changes in states 520 to 523 of tables for managing a history of the value of J. The state 520 is a dictionary compression start state, and J is unregistered. When M[4, 6] is generated, a management table becomes the state 521 in which 6 is registered in R0. When M[4, 8] is generated, the management table becomes the state 522 in which 8 is registered in R0, and 6 is moved to R1. When R1[5] is generated, the management table becomes the state 523 in which 6 is moved to R0, and 8 is moved to R1.

On the other hand, a character in which a matching character string is not found and that cannot be converted into the copy code is converted into a Literal code. Since an amount of data of the copy code is smaller than an amount of data of an original character string, the amount of data can be reduced by this conversion. This degree determines the compression ratio of the dictionary compression. When there are a plurality of matching character strings, the longest character string matching consecutively is selected and converted into the copy code. This is because there is an effect of further reducing the amount of data.

A reason why the dictionary compression described here is called an improved type is that a LZ77 algorithm, which is an origin of the dictionary compression, does not define the Rep code having a data reduction effect better than that of the Match code. In addition, there is no Rep code in the dictionary compression in LZ4. When LZ4-compressed data is created, the Match code is used instead of the Rep code. In addition, in dictionary compression in LZ4, L of a copy code is defined as 4 or more, and therefore, the Literal code is used instead of a copy code in which L is 3 or less.

Data to be input to the entropy encoding of the second half is a bit string in which the Literal code, the Match code, and the Rep code are expressed by prescribed bit patterns and are connected. The bit string in FIG. 1A is generated according to a rule of LZMA. A 10-bit length bit pattern 511 represents M[4, 6]. A 10-bit length bit pattern 512 represents M[4, 8]. A 7-bit length bit pattern 503 represents R1[5]. The Literal code is represented by a bit pattern of a 9-bit length in which 1 bit of 0 is added to a beginning of an 8-bit value of a character.

In the entropy coding, predicted values of appearance probabilities of 0 and 1 in the bit string are used to further transform the bit string into a shorter bit string. In LZMA, entropy coding called a range coder is used. Since this method is widely known, a description thereof will be omitted. In the entropy coding, generally, a bit string in which an appearance probability is easily predicted (a difference between appearance probabilities of 0 and 1 is large) has a better compression ratio. In contrast, a bit string in which an appearance probability is difficult to be predicted (the difference between the appearance probabilities of 0 and 1 is small) has a poor compression ratio.

Figure 2:
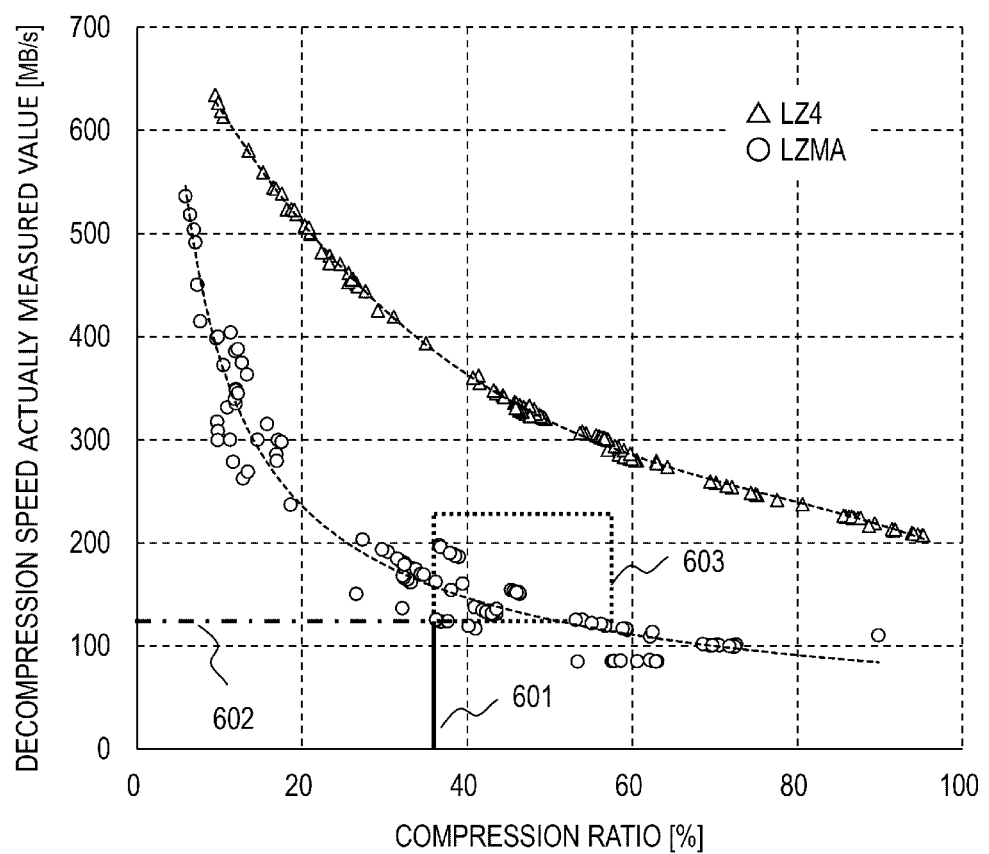
FIG. 2 shows a relation between a compression ratio and decompression performance of LZ4 and LZMA.

FIG. 2 shows a relation between a compression ratio and a decompression speed for each of compression algorithms of LZ4 and LZMA. A horizontal axis represents the compression ratio, and a vertical axis represents an actually measured value of the decompression speed. A measured value indicated by a triangle indicates a measurement result of LZ4, and a measured value indicated by a circle indicates a measurement result of LZMA. In any of the algorithms, the better the compression ratio of data is, the higher the decompression speed of compressed data tends to be.

However, in LZ4, a correlation between the compression ratio and the decompression speed is strong, and the correlation is approximately 1:1, whereas in LZMA, a correlation between the compression ratio and the decompression speed is weaker than that in LZ4, and a variation in the decompression speed is large even at the same compression ratio. Such a characteristic is due to the compression by entropy coding in LZMA. Namely, this is because depending on the data, it is difficult to easily predict the appearance probabilities of 0 and 1 in a bit string of a dictionary compression result.

In order to prevent the read performance of the storage system from being adversely influenced, if the data is compressed by selecting a compression algorithm having a good compression ratio and having a decompression speed equal to or higher than a reference value defined with respect to the decompression speed of the compressed data, it is possible to maximize a data reduction rate of the storage system without causing a problem in the read performance.

For example, when the reference value is 130 MB/s (602), data whose decompression speed is equal to or higher than the reference value is compressed with LZMA, and data whose decompression speed is lower than the reference value is compressed with LZ4. However, in order to know the decompression speed, a processing load is high when the system actually compresses and decompresses write data and measures the speed each time the system receives the write data.

Therefore, one conceivable method is to estimate the decompression speed during compression processing. As shown in FIG. 2, the decompression speed in LZMA has a weak correlation with the compression ratio. Therefore, reliability of estimating the decompression speed using the compression ratio is low.

For example, when LZMA is selected to compress data having a compression ratio of 35% (601) or less in LZMA and LZ4 is selected to compress other data, it is guaranteed that the decompression speed is equal to or higher than the reference value of 130 MB/s (602) for all data. However, for data in a region 603, LZ4 is selected for compression even though the decompression speed is equal to or higher than the reference value of 130 MB/s. Thus, there is no possibility that the data reduction rate of the system due to the selection of LZMA is increased.

In an embodiment of the present specification, the decompression speed is estimated based on a reference criterion having reliability higher than that of the compression ratio during the compression processing. The decompression speed is obtained by dividing a decompression data size by the decompression time, which is the same as estimating the decompression time. The decompression time is a time until the bit string shown in FIG. 1A is generated from the compressed data, is interpreted, is converted into various codes (Literal, Match, Rep), and is decompressed in plaintext.

For example, since decompression processing is executed using a code as a processing unit, the decompression time can be approximated by adding up predetermined processing times corresponding to various codes that are sources of the bit string by the number of appearances of codes. That is, when the number of code categories is N, the number of appearances of a dictionary compression code i (i=1 to N) used to configure a bit string at the time of compression is $X_i$, and a decompression processing unit price (processing time) per code is $W_i$, a decompression time T can be estimated according to the following equation. Here, $W_0$ is a decompression time component that does not depend on the number of appearances of the code.

$$T = W_0 + (W_1 \cdot X_1) + (W_2 \cdot X_2) + \ldots + (W_N \cdot X_N)$$

A table 700 in FIG. 3 is an example of a statistical table of the number of appearances of a code for estimating the decompression time of LZMA. Column 701 indicates the type of the code. Column 702 indicates a matching length L of a character string. Column 703 indicates a distance J between matching character strings. The matching length L and the distance J are represented by the number of characters.

Column 704 indicates the decompression processing unit price (processing time) $W_i$. The decompression processing unit price $W_i$ has a Literal code of 2 cycles, and a Match code of a matching length L of 17 or less and a distance J of 256 or less for 6 cycles. Column 705 indicates the number of appearances $X_i$. The number of appearances $X_i$ is 10859 for the Literal code, and 1135 for the Match code in which the matching length L is 17 or less and the distance J is 256 or less.

The number of code categories is broadly divided into three types (Literal, Match, Rep), but regarding the copy code, there is a possibility that the decompression processing unit price $W_i$ changes depending on the matching length L and the distance J. For codes including at least those having unequal decompression processing unit prices, the code categories are further divided, and the categories are defined such that the individual decompression processing unit prices are equal.

The number N of code categories is defined in this manner. When counting the number of appearances of each of the N types of codes, $X_i$ is counted up by 1 each time the code i is detected in a result of dictionary compression processing, and when all the results of the compression processing are observed, T is calculated from a value of the final $X_i$ and the value of $W_i$ using the above equation to estimate the decompression time.

Figure 4:
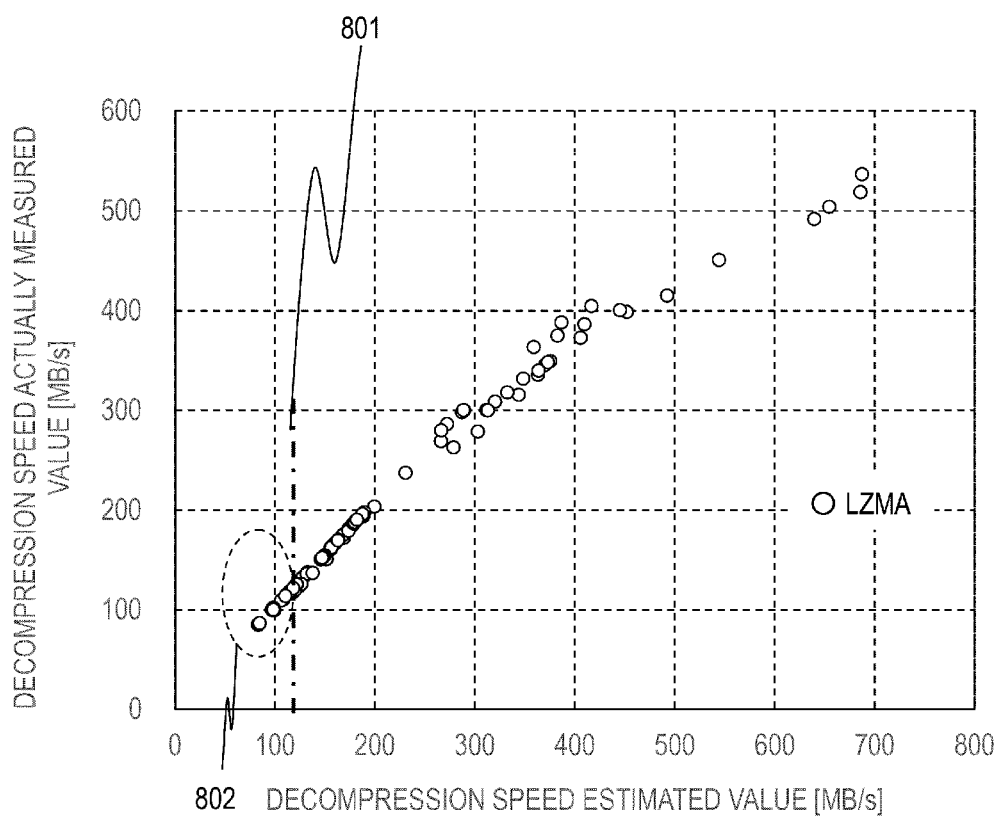
FIG. 4 shows a relation between estimated decompression performance and measured decompression performance of LZMA.

FIG. 4 shows a result of obtaining a decompression speed based on the decompression time estimated by the above equation and a decompression speed based on an actually measured decompression time and checking a correspondence relation between the decompression speeds. A horizontal axis represents a decompression speed estimated value, and a vertical axis represents a decompression speed actually measured value.

When the decompression speed is equal to or lower than 200 MB/s, the estimated value and the measured value substantially are almost the same. When the decompression speed is higher than 200 MB/s, an error between the estimated value and the measured value tends to increase. However, since a reference of the decompression speed when the compression algorithm is selected is set to, for example, a value lower than 200 MB/s that is a minimum decompression speed in LZ4, the decompression speed in LZMA can be practically estimated with high accuracy with this method.

Therefore, if LZ4 compression is applied only to data in which the estimated value of the decompression time according to the above equation is higher than the reference value (the decompression time corresponding to the reference of the decompression speed that does not adversely influence the read performance) at the time of LZMA compression, it is possible to guarantee that the read performance of the system is not adversely influenced. For example, when the reference value is 130 MB/s (801), data whose decompression speed calculated based on the estimated decompression time T is equal to or higher than the reference value is compressed with LZMA, and data whose decompression speed is lower than the reference value (data in a region 802) is compressed with LZ4. Since accuracy of estimating the decompression time (that is, accuracy of estimating the decompression speed) is increased according to a method of an embodiment of the present specification, an actual decompression speed of all data satisfies the reference value of 130 MB/s.

In an embodiment of the present specification, the LZ4 compression is selected only for data whose actual decompression speed does not satisfy the reference. In a method of determining the decompression speed based on the compression ratio according to FIG. 2, the LZMA compression is selected for the data in the region 603 in which the LZ4 compression is selected. That is, it is possible to maximize the data reduction rate while guaranteeing that the read performance of the system is not adversely influenced.

Although the method of selecting the compression method based on the decompression speed has been described, in an actual system, a method in which processing of calculating the decompression speed based on the decompression time is omitted, the reference value of the decompression time corresponding to the decompression speed that is the reference is calculated in advance, and the reference value is compared with the estimated decompression time T has a smaller calculation load. However, as described with reference to FIGS. 2 and 4, it is obvious that an effect of the embodiment can be obtained even when a method for calculating the decompression speed based on the estimated decompression time and comparing the decompression speed with the reference value is applied.

In addition, although it has been described that LZ4 based on the dictionary compression executed in the first half of LZMA is selected as the compression method when the decompression speed in LZMA does not satisfy the reference, since the compression method in which the decompression speed satisfies the reference can achieve an object of preventing the read performance from being adversely influenced, the compression method is not limited to LZ4, and other compression methods may be applied.

By selecting the compression method based on the decompression time estimated from current data, even when the current data is data indicating a decompression time different from a history of past data, it is possible to process the current data without any problem.

Based on the above description, a data compression system according to an embodiment of the present specification compresses data using a first compression algorithm to generate compressed data. For codes of a plurality of categories constituting the compressed data according to the first compression algorithm, the data compression system collects the number of appearances of each category. The data compression system estimates the decompression time of the compressed data by adding (product-sum) each number of appearances with a weight according to the code category, and compares the estimated value with a predetermined reference.

When it is determined that the estimated value is equal to or less than the reference value, the data compression system according to the embodiment of the present specification outputs data compressed using the first compression algorithm and data compressed using a second compression algorithm. When it is determined that the estimated value is greater than the reference, the data compression system outputs data compressed using the first compression algorithm.

When it is determined that the estimated value is equal to or less than the reference value, the data compression system according to the embodiment of the present specification outputs data compressed using the first compression algorithm and data compressed using the second compression algorithm. When it is determined that the estimated value is greater than the reference, the data compression system outputs data compressed using a third compression algorithm different from the first compression algorithm and the second compression algorithm. The compressed data using the third compression algorithm can be decompressed in a time shorter than the decompression time of the data compressed using both the first and second compression algorithms.

The dictionary compression algorithm is an example of the first compression algorithm, and an entropy encoding algorithm or a Huffman encoding algorithm is an example of the second compression algorithm. The embodiment of the present specification shows a great effect on these algorithms, but other types of compression algorithms may be used.

The decompression time can be estimated using a predetermined function. A product-sum function of the number of appearances of the code category and the weight of the code category can be effectively estimated by a simple method. Other functions can be used, and as described later, the function can include variable parameters. By correcting a variable parameter in accordance with a measured value of a decompression processing time, it is possible to more appropriately estimate the decompression time.

First Embodiment

Figure 5:
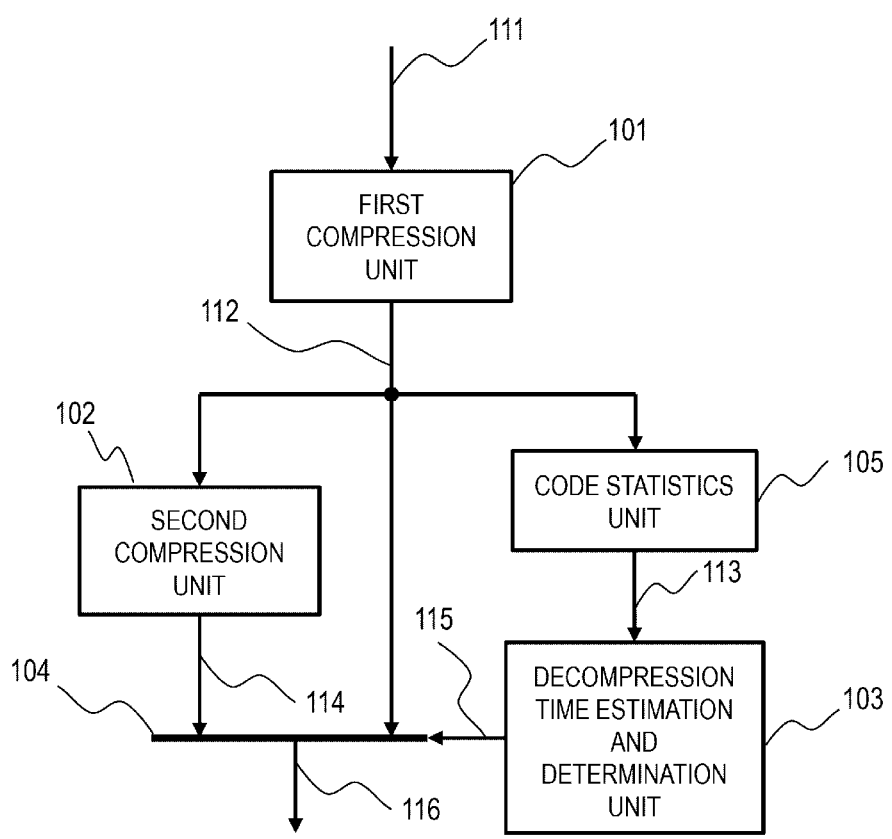
FIG. 5 shows an example of a data compression system that compresses data according to a first embodiment.

A first embodiment will be described with reference to FIGS. 5 to 8. FIG. 5 is an example of a configuration of a data compression system according to the first embodiment. In FIG. 5, the data compression system includes a first compression unit 101, a second compression unit 102, an decompression time estimation and determination unit 103, a data selection unit 104, a code statistics unit 105, and six types of signal lines 111 to 116. The first compression unit 101 and the second compression unit 102 are provided in a compression unit of the data compression system, and the data selection unit 104 is an output unit that outputs data.

The first compression unit 101 uses the first compression algorithm to compress data input from an outside of the data compression system through the input signal line 111, and outputs the compressed data to the signal line 112. The first compression algorithm is, for example, dictionary compression.

These signal lines 111 and 112 may be serial transmission lines that transmit the data in a series of signal patterns, or may be parallel transmission lines that transmit a plurality of data bits in parallel. Transmission control may be executed by transmitting a control signal for controlling transmission timings of these signal lines through a control signal line of a sideband (not illustrated in FIG. 5), or the data and the control signal may be transmitted through the same signal line. Data transmission may be executed by dividing the data into a plurality of packets and transmitting the data for each packet, or by occupying the signal line at a certain timing and transmitting the data at any timing.

The code statistics unit 105 collects, for each category, the number of appearances of codes included in the compressed data using the first compression algorithm output through the signal line 112, and outputs a result to the signal line 113. The signal line 113 may also be a serial transmission line or a parallel transmission line.

The second compression unit 102 further compresses, using the second compression algorithm different from the first compression algorithm, the data that is compressed by the first compression unit 101 and that is output from the signal line 112, and outputs the compressed data to the signal line 114. The second compression algorithm is, for example, entropy coding.

The decompression time estimation and determination unit 103 uses information on a collection result of the number of appearances of codes input from the signal line 113 to estimate, using the above calculation equation, a decompression time of the compressed data compressed by the second compression unit 102, and causes, based on the estimated value, the selection signal line 115 to select the compressed data to be output to the data selection unit 104.

Specifically, when the decompression time of the compressed data compressed by the second compression unit 102 is equal to or less than a predetermined threshold value, the decompression time estimation and determination unit 103 selects the compressed data that is compressed by the second compression unit 102 and that is transmitted through the signal line 114. On the other hand, when the decompression time of the compressed data compressed by the second compression unit 102 is greater than the predetermined threshold value, the decompression time estimation and determination unit 103 outputs the compressed data that is compressed by the first compression unit 101 and that is transmitted through the signal line 112.

The data selection unit 104 selects data designated by the decompression time estimation and determination unit 103 through the selection signal line 115, and outputs the selected data to the output signal line 116.

These signal lines 114 and 116 may be serial transmission lines or may be parallel transmission lines, similar to the signal lines 111 and 112. A control signal for controlling transmissions of these signal lines may be transmitted through the control signal line of the sideband (not illustrated in FIG. 5), or the data and the control signal may be transmitted through the same signal line.

The data may be transmitted for each packet, or the data may be freely transmitted by occupying the signal line at a certain timing. The selection signal line 115 may indicate a selection result at a voltage level, or may indicate the selection result as a pulse-like signal at a constant timing. A control line (not illustrated in FIG. 5) may be used to instruct the data selection unit 104 on a timing of selecting the data from the decompression time estimation and determination unit 103 or a timing of outputting the data to the signal line 116, or a signal for controlling the timing of selecting the data or the timing of outputting the data may be generated in the data selection unit 104.

For example, the first compression unit 101 may transmit the compressed data to the second compression unit 102 in response to the instruction from the decompression time estimation and determination unit 103. When the decompression time of the data to be compressed and output by the second compression unit 102 is equal to or less than the predetermined threshold value, the decompression time estimation and determination unit 103 instructs the first compression unit 101 to transmit the compressed data compressed by the first compression unit 101 to the second compression unit 102. Accordingly, compression processing executed by the second compression unit 102 can be omitted, the processing being unnecessary when the decompression time of the data to be compressed and output by the second compression unit 102 is greater than the threshold value. Accordingly, it is possible to shorten a total time required for the data compression system to compress data.

Figure 6:
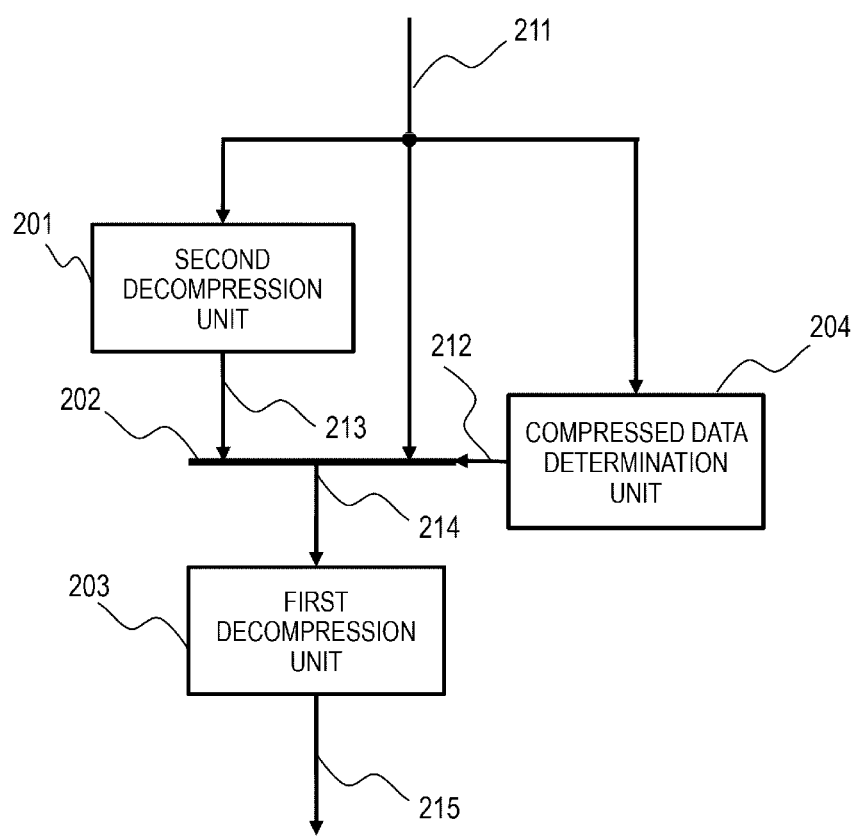
FIG. 6 shows an example of a data decompression system that decompresses data according to the first embodiment.

FIG. 6 is an example of a data decompression system that restores, to original plaintext data, data compressed by the data compression system in FIG. 5. In FIG. 6, the data decompression system includes a first decompression unit 203, a second decompression unit 201, a compressed data determination unit 204, a data selection unit 202, and five types of signal lines 211 to 215. The first decompression unit 203 decompresses data using a first decompression algorithm.

The first decompression unit 203 restores, using the first decompression algorithm, the data compressed using the first compression algorithm used by the first compression unit 101 in FIG. 5. The second decompression unit 201 decompresses, using a second decompression algorithm different from the first decompression algorithm, the data compressed using the second compression algorithm used by the second compression unit 102 in FIG. 5. The compressed data determination unit 204 determines whether the compressed data input to a data decompression unit is the data compressed by the first compression unit 101 in FIG. 5 or the data compressed by the second compression unit 102 in FIG. 5.

The second decompression unit 201 decompresses data that is input through the input signal line 211 and that is compressed using the second compression algorithm, and outputs the decompressed data to the signal line 213.

The compressed data determination unit 204 determines whether the compressed data input to the input signal line 211 is the data compressed by the first compression unit 101 or the data compressed by the second compression unit 102 in FIG. 5, and outputs a determination result to the data selection signal line 212.

For example, the compressed data determination unit 204 determines, based on data included in the compressed data, whether the compressed data is the compressed data using the first compression algorithm or the compressed data using the second compression algorithm. A determination result is output to the data selection signal line 212. For example, when a format of the compressed data always includes predetermined data (value) depending on the first algorithm and/or the second algorithm, the compression algorithm can be identified based on the predetermined data.

In another example, marker information indicating whether the compressed data is the compressed data compressed by the first compression unit 101 or the compressed data compressed by the second compression unit 102 may be added to the compressed data. The marker information may be added to the respective compressed data outputs in the first compression unit 101 and the second compression unit 102 in FIG. 5, or may be added to the data selection unit 104. The compressed data determination unit 204 can identify the compression algorithm based on the marker information acquired from the compressed data.

When a compressed data storage unit (not illustrated in FIGS. 5 and 6) is provided in the data compression system, the marker information may be added to the compressed data and stored and accumulated in the same manner as the compressed data. When the compressed data is once output to the outside of the data compression system and then the compressed data is input to the signal line 211 from the outside of the data compression system, the marker information may be added to the compressed data, and once output to the outside of the data compression system together with the compressed data, and then the marker information and the compressed data may be input together from the outside of the data compression system through the signal line 211.

When there is such marker information, the compressed data determination unit 204 only needs to receive the marker information, and does not need to receive the compressed data. In a data format of the entire compressed data, it may be determined whether the compressed data is the compressed data compressed by the first compression unit 101 or the compressed data compressed by the second compression unit 102 such that the compression method can be identified.

For example, the second decompression unit 201 may decompress the input compressed data in response to an instruction from the compressed data determination unit 204. When the compressed data is compressed by the second compression unit 102, the compressed data determination unit 204 instructs the second decompression unit 201 to decompress the compressed data. Accordingly, the decompression can be accurately executed, and unnecessary decompression processing can be omitted.

The data selection unit 202 selects the signal line 211 or the signal line 213 according to the determination result output from the compressed data determination unit 204 to the data selection signal line 212. Specifically, when it is determined that the compressed data input to the signal line 211 is the data compressed by the first compression unit 101, the compressed data input to the signal line 211 is selected. When it is determined that the compressed data input to the signal line 211 is the data compressed by the second compression unit 102, decompressed data that is decompressed by the second decompression unit 201 and that is output to the signal line 213 is selected. The data selection unit 202 outputs the selected data to the data selection output signal line 214.

When a time is required for decompressing the data by the second decompression unit 201, the data selection unit 202 may further include a buffer (not illustrated in FIG. 2). The data selection unit 202 may temporarily store, in the buffer, the compressed data input to the input signal line 211 and the determination result output to the data selection signal line 212 according to the determination from the compressed data determination unit 204, and wait until the decompressed data from the second decompression unit 201 is output to the signal line 213.

The first decompression unit 203 decompresses the data output to the data selection output signal line 214 using the first decompression algorithm for restoring the data compressed using the first compression algorithm used by the first compression unit 101, and outputs the decompressed data to the output signal line 215.

These signal lines 211, 213, 214, and 215 may be serial transmission lines or parallel transmission lines, similar to the signal lines 111, 112, 114, and 116. A control signal for controlling the transmissions of these signal lines may be transmitted through the control signal line of the sideband (not illustrated in FIG. 6), or the data and the control signal may be transmitted through the same signal line.

The data may be transmitted for each packet, or the data may be freely transmitted by occupying the signal line at a certain timing. Similar to the selection signal line 115, the data selection signal line 212 may indicate the selection result at a voltage level, or may indicate the selection result as a pulse-like signal at a constant timing. A control line (not illustrated in FIG. 6) may be used to instruct the data selection unit 202 on a timing of selecting the data from the compressed data determination unit 204 or a timing of outputting the data to the signal line 214. The signal for controlling the timing of selecting the data or the timing of outputting data may be generated in the data selection unit 202.

Figure 7:
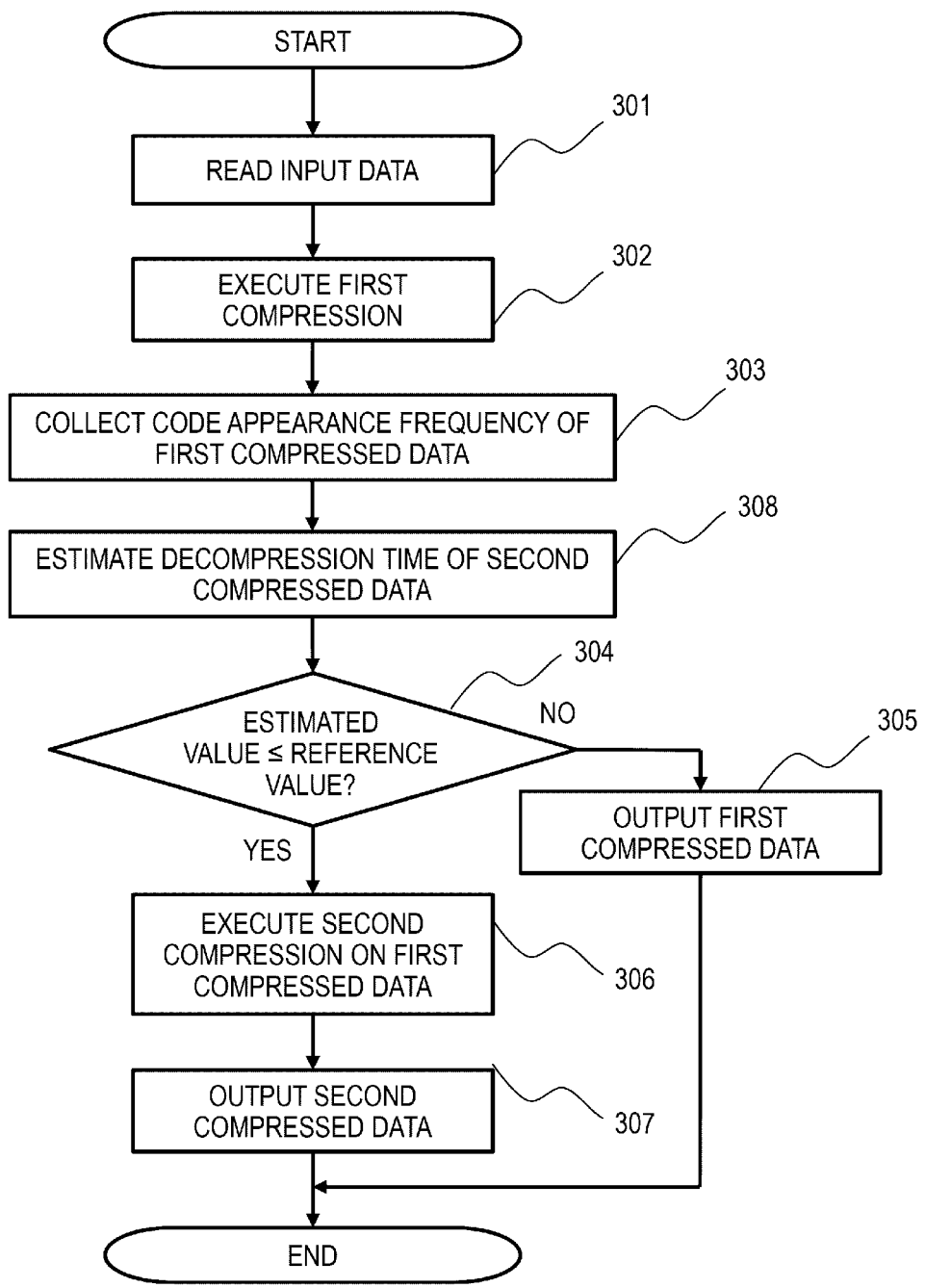
FIG. 7 shows an example of a flowchart for compressing the data according to the first embodiment.

FIG. 7 shows a flowchart of a data compression method according to the first embodiment. In FIG. 7, in step 301, the first compression unit 101 reads input data to be compressed. Next, in step 302, the first compression unit 101 compresses the input data read in step 301 using the first compression algorithm. In step 303, the code statistics unit 105 collects the number of appearances of codes included in the data compressed in step 302.

In step 308, the decompression time estimation and determination unit 103 estimates the decompression time based on the number of appearances of codes collected in step 303, and compares the estimated decompression time with a predetermined reference value in step 304. When the estimated decompression time is equal to or less than the reference value (304: YES), the flow further proceeds to step 306. The second compression unit 102 further compresses, using the second compression algorithm, the compressed data compressed using the first compression algorithm in step 302. In step 307, the data selection unit 104 outputs the data compressed using the second compression algorithm.

In step 304, when the decompression time estimated in step 308 is greater than the reference value (304: NO), the flow proceeds to step 305. In step 305, the data selection unit 104 outputs the data compressed using the first compression algorithm.

As described above, in the data compression system according to the present embodiment, the first compression method compresses the data using the first compression algorithm, and the second compression method compresses the data using the first compression algorithm and then further compresses the data using the second compression algorithm.

According to the data compression method described above, when the decompression time estimated using the number of appearances of codes included in the data compressed using the first compression algorithm is equal to or less than the reference value, the compressed data is output without compressing the data using the second compression algorithm, so that it is possible to shorten the total time for compressing the data. Further, it is possible to determine, simply by using the compressed data compressed using the first compression algorithm, whether to execute the compression using only the first compression algorithm or the compression using the second compression algorithm in addition to the first compression algorithm. It is not necessary to execute the compression processing using the second compression algorithm for the determination.

Figure 8:
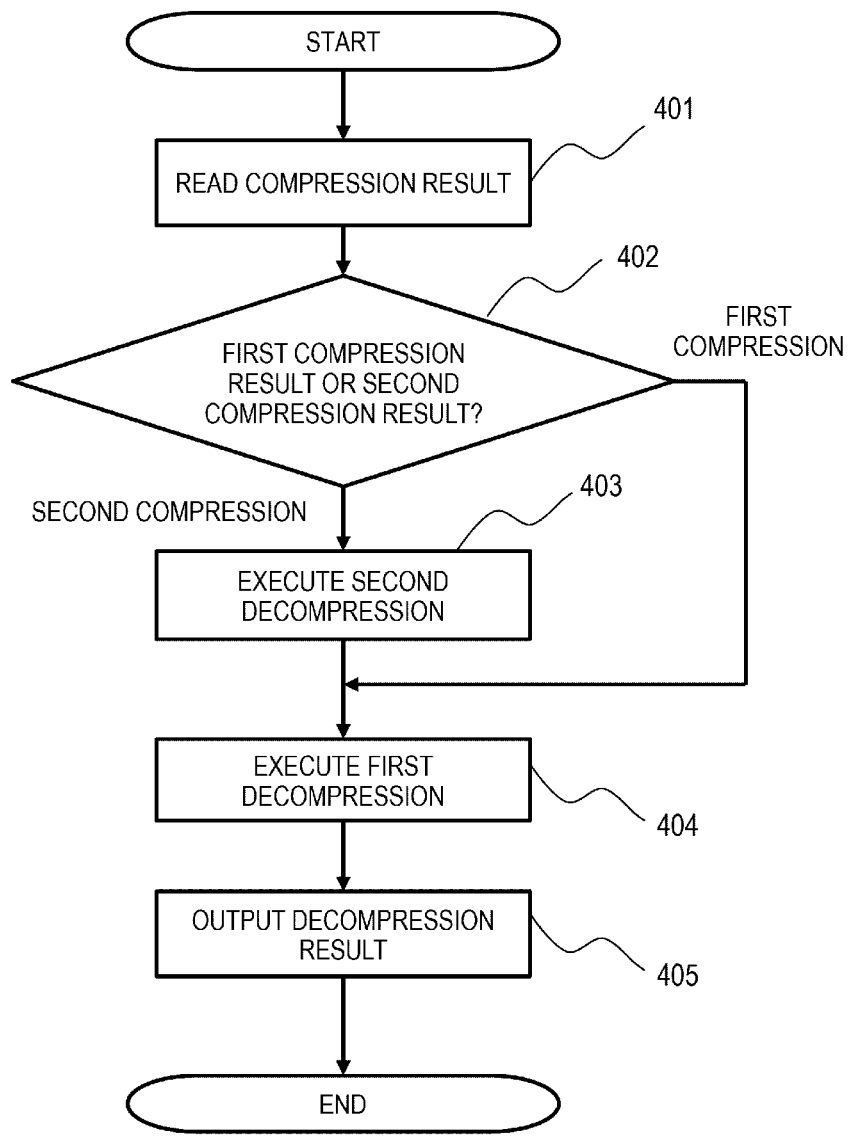
FIG. 8 shows an example of a flowchart for decompressing the data according to the first embodiment.

FIG. 8 is a flowchart of a data decompression method for restoring the data compressed by the data compression method in FIG. 7. In FIG. 8, first, in step 401, the compressed data determination unit 204 reads the compressed data. Next, in step 402, the compressed data determination unit 204 determines whether the read compressed data is the compressed data using the first compression algorithm in step 302 or the compressed data using the second compression algorithm in step 306 in FIG. 7.

In step 402, for example, based on the data included in the compressed data, it is determined whether the compressed data is the compressed data using the first compression algorithm in step 302 or the compressed data using the second compression algorithm in step 306 in FIG. 7. For example, when the format of the compressed data always includes predetermined data (value) depending on the first algorithm and/or the second algorithm, the compression algorithm can be identified based on the predetermined data.

Alternatively, the compression method of the compressed data can be specified by referring to the marker information indicating whether the compressed data is the compressed data compressed by the first compression unit 101 or the compressed data compressed by the second compression unit 102. Based on identification information attached to the compressed data, including the data included in the compressed data, newly added marker information, or a case in which the compressed data is represented in the data format of the entire compressed data, the data decompression system specifies whether the data is compressed by the first compression method or the second compression method.

When it is determined that the received data is the compressed data using the second compression algorithm in step 306 (402: second compression), in step 403, the second decompression unit 201 decompresses the input compressed data using the second compression algorithm and restores the data compressed using the first compression algorithm. In step 404, the first decompression unit 203 decompresses the restored data compressed using the first compression algorithm, and restores the original plaintext data before compression.

When it is determined that the compressed data is the compressed data using the second compression algorithm in step 306 (402: first compression), step 403 is skipped. In step 404, the first decompression unit 203 decompresses the compressed data that is not decompressed by the second decompression unit 201, and restores the original plaintext data before compression.

According to the data decompression method described above, it is possible to correctly decompress the data compressed using the first compression algorithm or the data compressed using the first compression algorithm and the second compression algorithm by the data compression method in FIG. 7.

Each function (specifically, the compression unit, the code statistics unit, the decompression time estimation and determination unit, the decompression unit, the compressed data determination unit, and the like) in the data compression system and the data decompression system described above can be mounted by one or more processors that operate in accordance with a program and/or a logic circuit that executes a predetermined operation. This point also applies to other embodiments.

Second Embodiment

Figure 9:
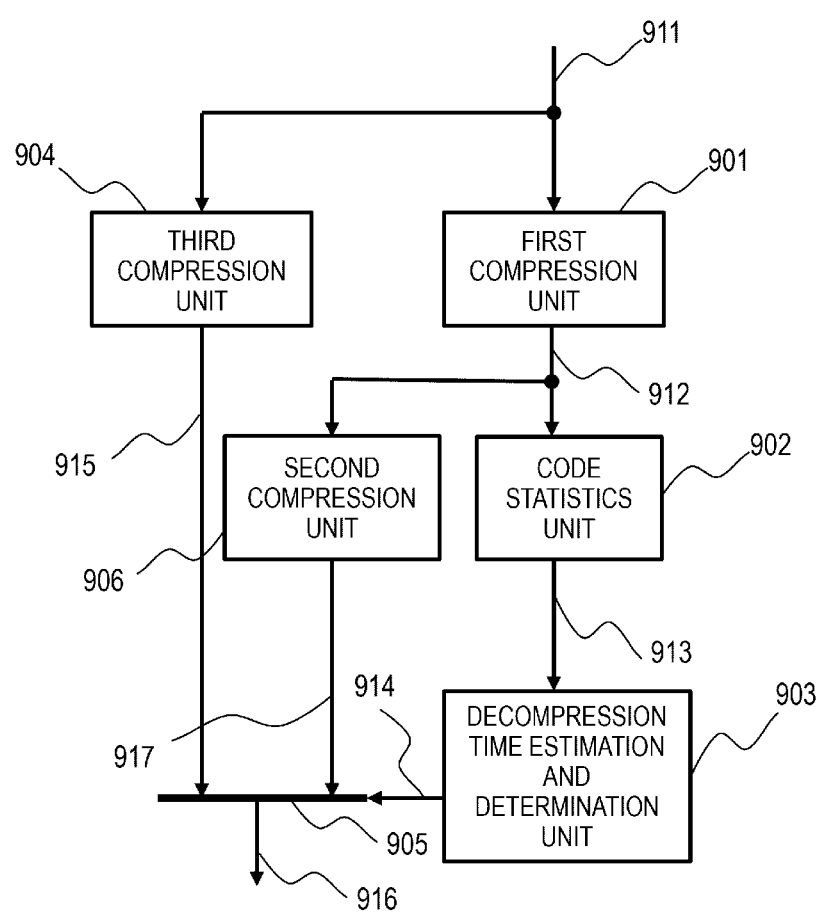
FIG. 9 shows an example of a data compression system that compresses data according to a second embodiment.

Next, a second embodiment will be described with reference to FIGS. 9 and 10. FIG. 9 is an example of a configuration of a data compression system according to the second embodiment. In FIG. 9, the data compression system includes a first compression unit 901, a second compression unit 906, a third compression unit 904, a code statistics unit 902, a decompression time estimation and determination unit 903, a data selection unit 905, and seven types of signal lines 911 to 917.

The first compression unit 901 compresses data using a first compression algorithm that is predetermined. The first compression algorithm is, for example, dictionary compression. The second compression unit 906 compresses the compressed data using a second compression algorithm that is predetermined. The second compression algorithm is, for example, entropy coding. The third compression unit 904 compresses data using a third compression algorithm that is predetermined.

The third compression algorithm may be the same as or different from the first or second compression algorithm. As the third compression algorithm, for example, entropy coding or Huffman coding can be used. In one example, the third compression algorithm may be an algorithm capable of generating compressed data whose decompression time is equal to or less than a predetermined reference value. An algorithm that satisfies this condition can be designed by measuring a decompression time of compressed data of various types of input data.

The code statistics unit 902 receives a compression result of the first compression unit 901, and collects the number of appearances of codes included in the compressed data. The decompression time estimation and determination unit 903 uses the above calculation equation based on information on the number of appearances of codes collected by the code statistics unit 902 to estimate the decompression time of the compressed data using the first and second compression algorithms, compares the decompression time with the above reference value, and determines whether the decompression time is equal to or less than the reference value or is greater than the reference value. The data selection unit 905 selects the compressed data to be output.

The first compression unit 901 compresses the data input through the input signal line 911 using the first compression algorithm that is predetermined, and outputs the compressed data serving as a compression result to the output signal line 912. The code statistics unit 902 receives the compressed data output to the signal line 912, and collects the number of appearances of codes included in the compressed data. The collected information on the number of appearances of codes is transmitted to the decompression time estimation and determination unit 903 through the signal line 913.

The second compression unit 906 compresses, using the second compression algorithm, the compressed data which is compressed using the first compression algorithm and is input through the signal line 912, and outputs a result to the signal line 917.

The third compression unit 904 compresses, using the third compression algorithm, the data input to the signal line 911, and outputs a result to the signal line 915.

The decompression time estimation and determination unit 903 receives, through the signal line 913, the information on the number of appearances of codes collected by the code statistics unit 902, and estimates, based on the received information, the decompression time of the data compressed by the first compression unit 901 and the second compression unit 906. Then, the decompression time estimation and determination unit 903 compares the estimated decompression time with the predetermined reference value.

When the estimated decompression time is equal to or less than the reference value, the decompression time estimation and determination unit 903 outputs a data selection signal to the data selection unit 905 via the signal line 914 so as to select the compressed data using the first compression unit 901 and the second compression unit 906. When the estimated decompression time is greater than the reference value, the decompression time estimation and determination unit 903 outputs a data selection signal to the data selection unit 905 via the signal line 914 so as to select the compressed data using the third compression unit 904.

The data selection unit 905 selects, in accordance with the data selection signal input from the decompression time estimation and determination unit 903 via the signal line 914, either the compressed data that is received from the signal line 917 and that is compressed by the first compression unit 901 and the second compression unit 906 or the compressed data that is received from the signal line 915 and that is compressed by the third compression unit 904, and outputs the selected data to the output signal line 916.

As described above, in the data compression system according to the present embodiment, the data is compressed using the first and second compression algorithms in the first compression method, and the data is compressed using the third compression algorithm in the second compression method. The compressed data whose decompression time is equal to or less than the reference value is generated using the third compression algorithm.

The data compression system estimates, based on the number of appearances of codes included in the compressed data using the first compression algorithm, the decompression time of the compressed data using the first and second compression algorithms, determines whether the decompression time is greater than the predetermined reference value by comparing the decompression time with the reference value, and selects the compressed data whose decompression time is equal to or less than the reference value.

In the above description, the signal lines 911, 912, 915, 916, and 917 may be serial transmission lines or parallel transmission lines, similar to the signal lines 111 and 112 in FIG. 5 according to the first embodiment. The control signal for controlling the transmissions of the signal lines may be transmitted through the control signal line of the sideband (not illustrated in FIG. 9), or the data and the control signal may be transmitted through the same signal line.

The data may be transmitted for each packet, or the data may be freely transmitted by occupying the signal line at a certain timing. The signal line 913 that transmits information on a code appearance frequency from the code statistics unit 902 may be a serial transmission line or a parallel transmission line, similar to the signal line 113 in FIG. 5 according to the first embodiment. The signal line of the sideband (not illustrated in FIG. 9) related to signal transmission control may be provided, or the information on the code appearance frequency and the control signal may be transmitted by the same signal line.

Similar to the selection signal line 115 in FIG. 5 according to the first embodiment, the signal line 914 that transmits the data selection signal may indicate the selection result at a voltage level or may indicate the selection result as a pulse-like signal at a constant timing. A control line (not illustrated in FIG. 9) may be used for the decompression time estimation and determination unit 903 to instruct the data selection unit 905 on a timing of selecting the data or a timing of outputting the compressed data to the signal line 916. A signal for controlling the timing of selecting the compressed data or the timing of outputting the compressed data may be generated in the data selection unit 905.

As described above, the code statistics unit 902 collects the number of appearances of codes for the result of compression by the first compression unit 901 using the first compression algorithm. Based on the collection result, the decompression time estimation and determination unit 903 estimates and determines the decompression time. Accordingly, when the result of the compression using the first and second compression algorithms is decompressed, it is possible to confirm that the decompression time is equal to or less than the predetermined reference value, and to output the compressed data serving as the result of the compression by the first compression unit 901 and the second compression unit 906.

When it is found that the decompression time is greater than the predetermined reference value in a case in which the data is compressed using the first compression algorithm in the first compression unit 901, the data compression system adopts the result of the compression using the third compression algorithm in the third compression unit 904. The result of the compression by the third compression unit 904 has a decompression time equal to or less than the reference value. Accordingly, it is possible to prevent the decompression time from exceeding the reference value.

In the data selection unit 905, a determination of whether to use the result of the compression using the first and second compression algorithms or the result of the compression using the third compression algorithm can be executed by calculating only the number of appearances of codes obtained based on the compressed data using the first compression algorithm and the estimated decompression time based on the number of appearances of codes. It is not necessary to execute the compression processing using the second and third compression algorithms in order to execute this determination.

Figure 10:
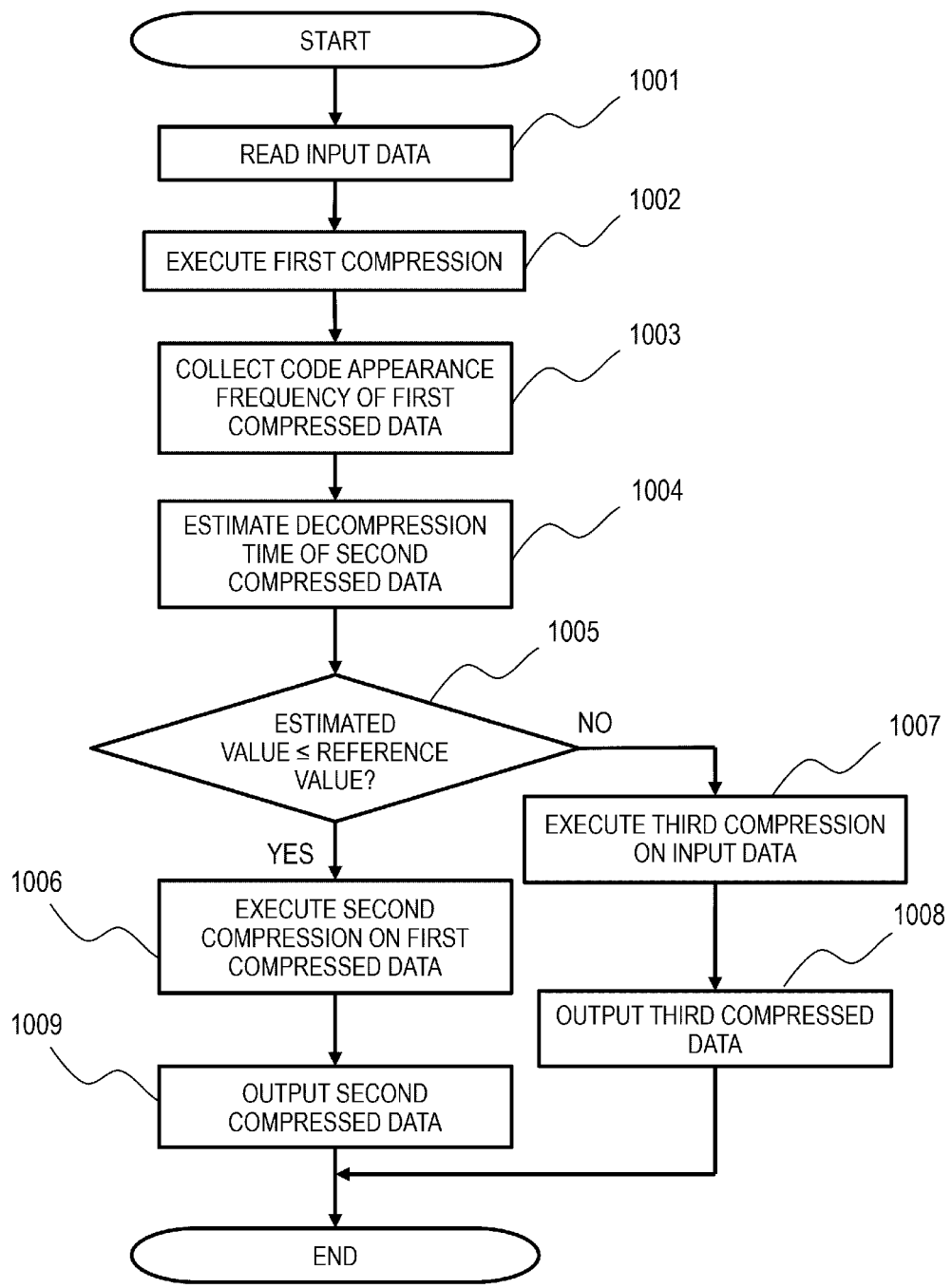
FIG. 10 shows an example of a flowchart for compressing the data according to the second embodiment.

FIG. 10 shows a flowchart of a data compression method according to the second embodiment. In FIG. 10, in step 1001, the first compression unit 901 reads input data to be compressed. Next, in step 1002, the first compression unit 901 compresses the input data using the first compression algorithm that is predetermined.

In step 1003, the code statistics unit 902 collects the number of appearances of codes included in the compressed data obtained by compressing the input data using the first compression algorithm in step 1002. In step 1004, the decompression time estimation and determination unit 903 estimates, based on the information on the number of appearances of codes collected in step 1003, a time required for decompressing the data compressed using the first and second compression algorithms.

In step 1005, the decompression time estimation and determination unit 903 determines whether the decompression time estimated in step 1004 is equal to or less than the predetermined reference value. When the decompression time is equal to or less than the predetermined reference value (1005: YES), the flow proceeds to step 1006. In step 1006, the second compression unit 906 compresses, using the second compression algorithm, the data compressed by the first compression unit 901 in step 1002. In step 1009, the data selection unit 905 outputs the data compressed in step 1006.

In step 1005, when the decompression time estimated in step 1004 is greater than the predetermined reference value (1005: NO), the flow proceeds to step 1007. The third compression unit 904 compresses the input data read in step 1001 using the third compression algorithm for generating the compressed data whose decompression time is equal to or less than the reference value. In step 1008, the data selection unit 905 outputs the data compressed in step 1007.

According to the data compression method described above, when the decompression time estimated using the number of appearances of codes included in the data compressed using the first compression algorithm is equal to or less than the reference value, the compressed data is output without compressing the data using the second compression algorithm, so that it is possible to shorten a total time for compressing the data. Further, it is possible to determine, simply by using the compressed data compressed using the first compression algorithm, whether to execute the compression using only the third compression algorithm or the compression using the first and second compression algorithms. It is not necessary to execute the compression processing using the second and third compression algorithms for this determination.

Third Embodiment

Figure 11:
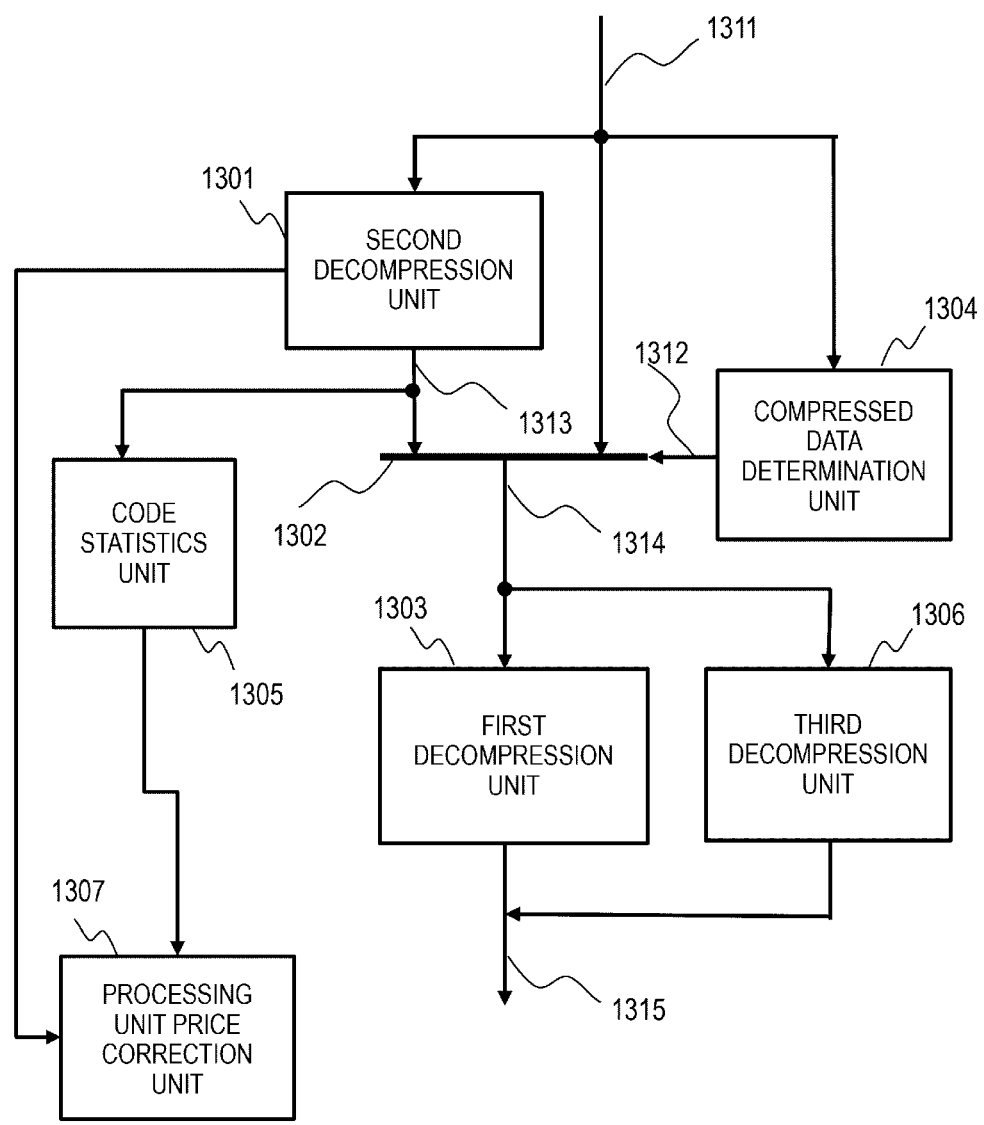
FIG. 11 shows an example of a data decompression system that decompresses data according to a third embodiment.
Figure 12:
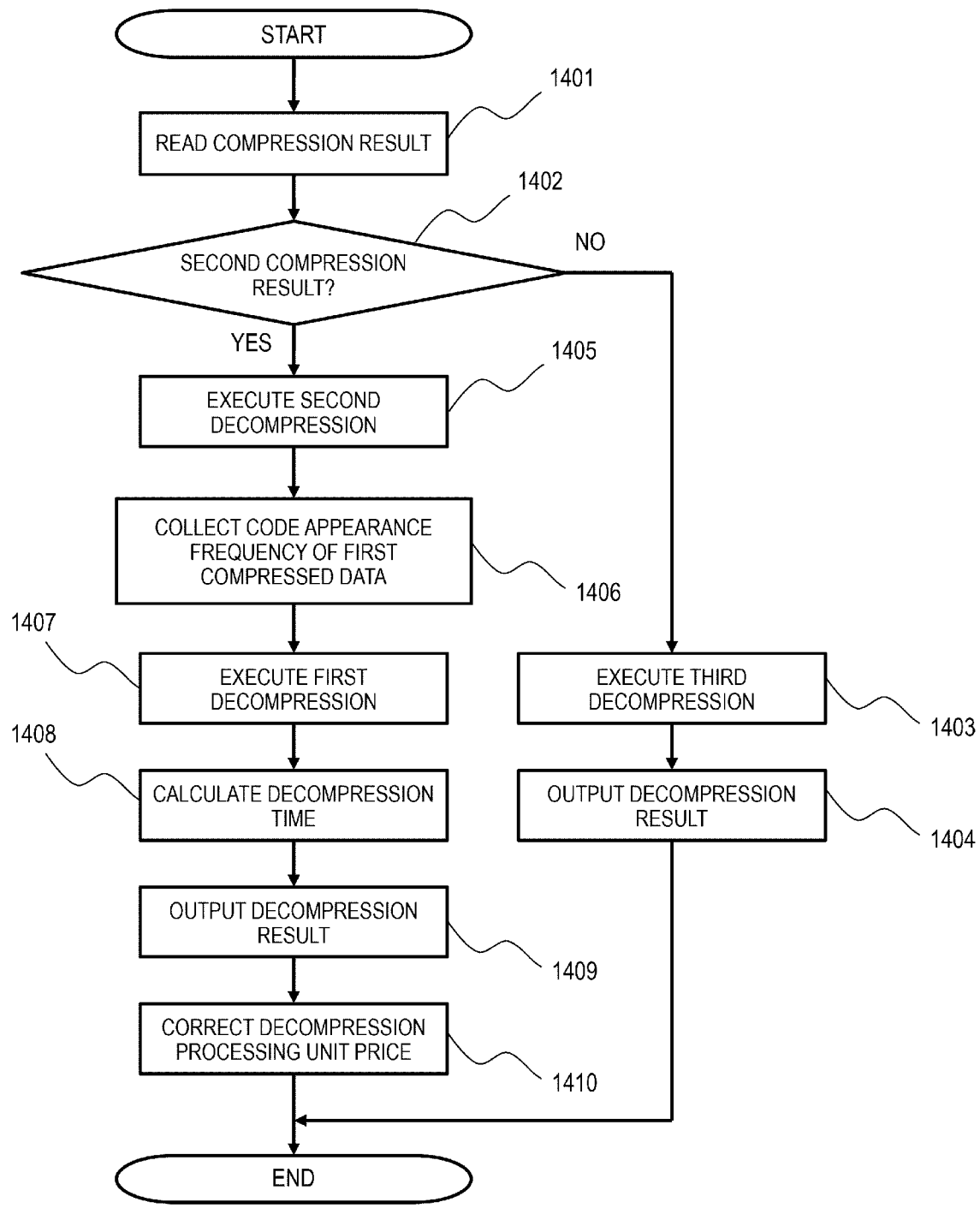
FIG. 12 shows an example of a flowchart for decompressing the data according to the third embodiment.

FIG. 11 is an example of a data decompression system for improving accuracy of estimating the decompression time in the data compression system according to the above embodiment. FIG. 12 is a flowchart of a data decompression method involving correction of a decompression processing unit price in the data decompression system in FIG. 11.

In the present embodiment, the data decompression system includes a configuration shown in FIG. 11 instead of the configuration shown in FIG. 6 according to the above second embodiment. Data decompression is executed by a method shown in FIG. 12 instead of the method shown in FIG. 8 according to the above second embodiment. In the present embodiment, a data compression system and a data compression method are the same as those in the above first or second embodiment.

FIG. 11 is an example of the data decompression system that restores, to original plaintext data, data compressed by the data compression system according to the above embodiments. In FIG. 11, the data decompression unit includes a first decompression unit 1303, a second decompression unit 1301, a third decompression unit 1306, a compressed data determination unit 1304, a code statistics unit 1305, a data selection unit 1302, a processing unit price correction unit 1307, and five types of signal lines 1311 to 1315. When the data compression system includes the configuration shown in FIG. 5, the third decompression unit 1306 may not be provided.

The first decompression unit 1303 restores, using a first decompression algorithm, the data compressed using the first compression algorithm by the first compression unit (101 or 901). The second decompression unit 1301 decompresses, using a second decompression algorithm different from the first decompression algorithm, the data compressed using the second compression algorithm by the second compression unit (102 or 906). The third decompression unit 1306 decompresses, using a third decompression algorithm different from the first and second decompression algorithms, the data compressed using the third compression algorithm by the third compression unit (904).

The second decompression unit 1301 decompresses the data that is input through an input signal line 1311 and that is compressed using the second compression algorithm, and outputs the decompressed data to the signal line 1313.

The compressed data determination unit 1304 determines by which of the first compression unit, the second compression unit, and the third compression unit the compressed data input to the input signal line 1311 is compressed, and outputs a determination result to the data selection signal line 1312.

The compressed data determination unit 1304 executes the determination based on, for example, the data included in the compressed data. The determination result is output to the data selection signal line 1312. For example, when the format of the compressed data always includes predetermined data (value) depending on the compression algorithm, the compression algorithm can be identified based on the predetermined data.

In another example, marker information indicating by which of the first compression unit, the second compression unit, and the third compression unit the compressed data is compressed may be added to the compressed data. The marker information may be added to the respective compressed data outputs in the first compression unit, the second compression unit, and the third compression unit, or may be added to the data selection unit (104 or 905). The compressed data determination unit 1304 can identify the compression algorithm based on the marker information acquired from the compressed data.

When a compressed data storage unit (not illustrated) is provided in the data decompression system, the marker information may be added to the compressed data and stored and accumulated in the same manner as the compressed data. The compressed data may be once output to the outside of the data decompression system, and then the compressed data may be input to the signal line 1311 from the outside of the data decompression system. In this case, the marker information may be added to the compressed data and once output to the outside of the data decompression system together with the compressed data, and then the marker information and the compressed data may be input together from the outside of the data decompression system through the signal line 1311.

When there is such marker information, the compressed data determination unit 1304 only needs to receive the marker information, and does not need to receive the compressed data. In a data format of the entire compressed data, it may be determined by which of the first compression unit, the second compression unit, and the third compression unit the compressed data is compressed such that the compression method can be identified.

For example, the second decompression unit 1301 may decompress the input compressed data in response to an instruction from the compressed data determination unit 1304. When the compressed data is compressed by the second compression unit, the compressed data determination unit 1304 instructs the second decompression unit 1301 to decompress the compressed data. Accordingly, the decompression can be accurately executed, and unnecessary decompression processing can be omitted.

The data selection unit 1302 selects the signal line 1311 or the signal line 1313 according to the determination result output from the compressed data determination unit 1304 to the data selection signal line 1312. Specifically, when it is determined that the compressed data input to the signal line 1311 is the data compressed by the first compression unit and the third compression unit, the compressed data input to the signal line 1311 is selected. When it is determined that the compressed data input to the signal line 1311 is the data compressed by the second compression unit, decompressed data that is decompressed by the second decompression unit 1301 and that is output to the signal line 1313 is selected. The data selection unit 1302 outputs the selected data to the data selection output signal line 1314.

When a time is required for decompressing the data in the second decompression unit 1301, the data selection unit 1302 may further include a buffer (not illustrated in FIG. 11). The data selection unit 1302 may temporarily store, in the buffer, the compressed data input to the input signal line 1311 and the determination result output to the data selection signal line 1312 according to the determination from the compressed data determination unit 1304, and wait until the decompressed data from the second decompression unit 131 is output to the signal line 1313.

The processing unit price correction unit 1307 corrects the decompression processing unit price Wi based on a measured value of a decompression processing time in the second decompression unit 1301 and the number of appearances Xi of codes included in an output of the second decompression unit 1301.

In response to the instruction from the compressed data determination unit 1304, the first decompression unit 1303 decompresses the data output to the data selection output signal line 1314 using the first decompression algorithm for restoring the data compressed by the first compression unit, and outputs the decompressed data to an output signal line 1315.

In response to the instruction from the compressed data determination unit 1304, the third decompression unit 1306 decompresses the data output to the data selection output signal line 1314 using the third decompression algorithm for restoring the data compressed by the third compression unit, and outputs the decompressed data to the output signal line 1315.

These signal lines 1311, 1313, 1314, and 1315 may be serial transmission lines or parallel transmission lines, similar to the signal lines 211, 213, 214, and 215. A control signal for controlling the transmissions of these signal lines may be transmitted through the control signal line of the sideband (not illustrated in FIG. 11), or the data and the control signal may be transmitted through the same signal line.

The data may be transmitted for each packet, or the data may be freely transmitted by occupying the signal line at a certain timing. Similar to the selection signal line 212, the data selection signal line 1312 may indicate the selection result at a voltage level, or may indicate the selection result as a pulse-like signal at a constant timing. A control line (not illustrated in FIG. 11) may be used to instruct the data selection unit 1302 on a timing of selecting the data from the compressed data determination unit 1304 or a timing of outputting the data to the signal line 1314. A signal for controlling the timing of selecting data or the timing of outputting data may be generated in the data selection unit 1302.

In FIG. 12, first, in step 1401, the compressed data determination unit 1304 reads the compressed data. Next, in step 1402, the compressed data determination unit 1304 determines which compression algorithm is used to compress the read compressed data.

In step 1402, for example, it is determined, based on the data included in the compressed data, using which compression algorithm the compressed data is compressed. For example, when the format of the compressed data always includes predetermined data (value) depending on the compression algorithm, the compression algorithm can be identified based on the predetermined data.

Alternatively, the compression algorithm of the compressed data can be specified by referring to the marker information indicating which compression algorithm is used for the compressed data. Based on identification information attached to the compressed data including the data included in the compressed data, newly added marker information, and a case in which the compressed data is represented in the data format of the entire compressed data, the data decompression system specifies by which compression algorithm the compressed data is compressed.

When it is determined that the received data is the compressed data using the second compression algorithm (1402: YES), in step 1405, the second decompression unit 1301 decompresses the input compressed data using the second compression algorithm and restores the data compressed using the first compression algorithm. In step 1406, the code statistics unit 1305 collects the number of appearances of codes included in the data that is output from the second decompression unit 1301 and that is compressed using the first compression algorithm.

In step 1407, the first decompression unit 1303 decompresses the restored data compressed using the first compression algorithm, and restores the original plaintext data before compression. In step 1408, the second decompression unit 1301 calculates a time required for the second decompression unit 1301 to execute data decompression processing. For example, the second decompressing unit 1301 may measure a time from the start of the decompression to the end of the decompression and hold a result of the measurement. Then, in step 1409, plaintext data serving as a decompression result is output.

In step 1410, the processing unit price correction unit 1307 corrects the decompression processing unit price Wi using an actual decompression time calculated in step 1408 and the number of appearances of codes collected in step 1406 such that an estimation error for the decompression time in the data compression system is small. Specifically, the decompression time is estimated by changing Wi slightly in a trial manner, and if an error between the estimated time and the actual decompression time reduces, the change is applied to the subsequent decompression processing unit price Wi. If the error between the estimated time and the actual decompression time increases, the change is discarded.

On the other hand, when it is determined that the received data is the compressed data using the first compression algorithm (the first embodiment) or the third compression algorithm (the second embodiment) (1402: NO), in step 1403, the first decompression unit 1303 or the third decompression unit 1306 decompresses the compressed data, and restores the original plaintext data before compression. Then, in step 1404, plaintext data serving as the decompression result is output.

When the data compression system includes the configuration shown in FIG. 5, it is not necessary to determine in step 1402 that the data is compressed data using the third compression algorithm, and it is not necessary to execute the decompression by the third decompression unit 1306 in step 1403.

In the above example, the decompression processing time only in the second decompression unit 1301 is measured. In another example, in addition to the decompression processing time in the second decompression unit 1301, a decompression processing time in the first decompression unit 1303 may be measured. The decompression processing unit price indicates a total of the decompression processing of the first decompression unit 1303 and the second decompression unit 1301.

According to the data decompression method described above, the data compressed using the first compression algorithm, the data compressed using the first and second compression algorithms, or the data compressed using the third compression algorithm in the data compression system and the compression method according to the first embodiment or the second embodiment can be correctly decompressed. Further, by using the actual decompression time and the collected number of appearances of codes of the compressed data using the first and second compression algorithms to correct the decompression processing unit price so as to reduce the estimation error for the decompression time in the data compression system, it is possible to improve accuracy of estimating the decompression time in the decompression time estimation and determination unit of the data compression system.

Each function (specifically, the compression unit, the code statistics unit, the decompression time estimation and determination unit, the decompression unit, the compressed data determination unit, and the like) in the data compression system and the data decompression system described above can be mounted by one or more processors that operate in accordance with a program and/or a logic circuit that executes a predetermined operation. This point also applies to other embodiments.

Fourth Embodiment

Figure 13:
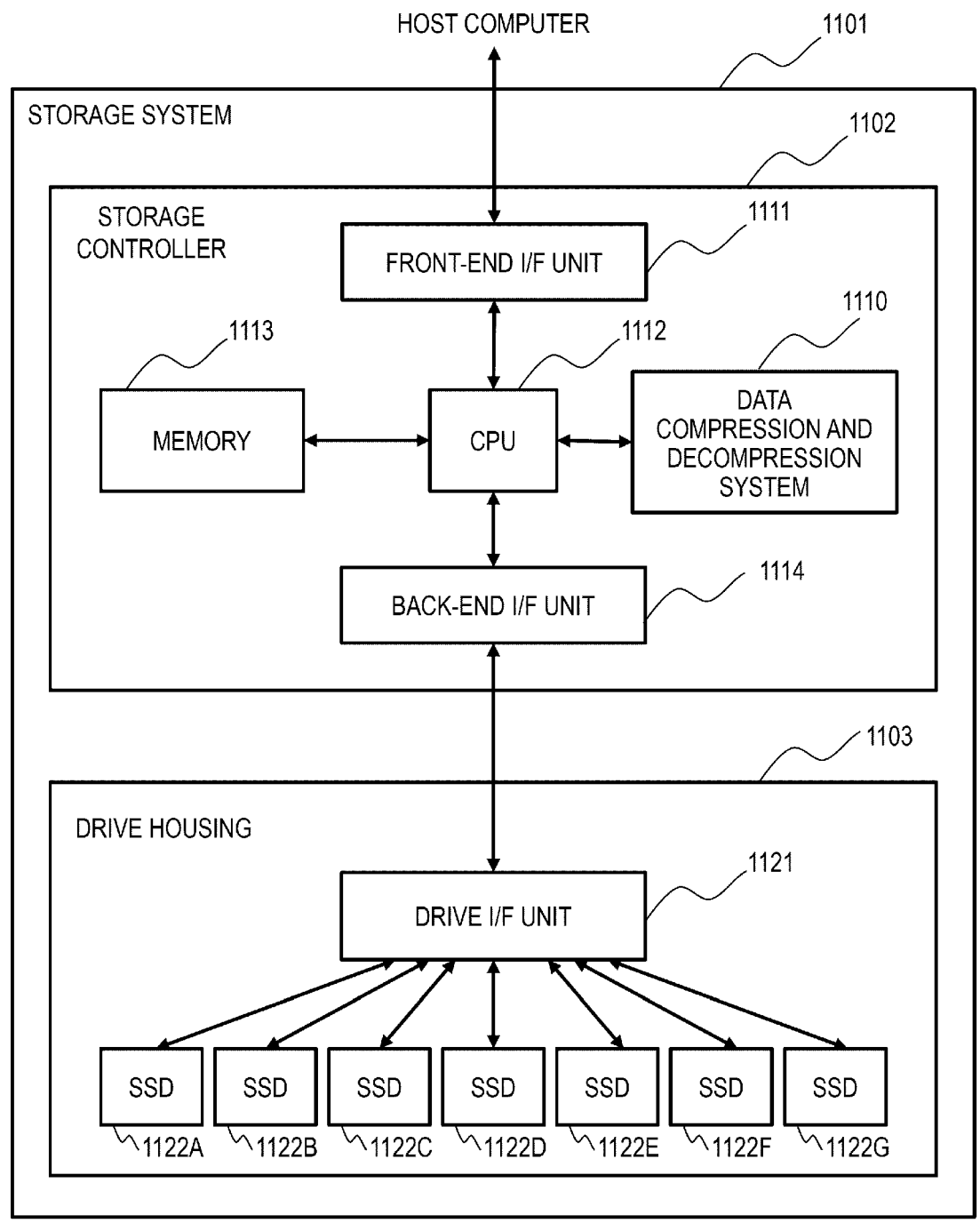
FIG. 13 shows an example of an overall configuration of a storage system to which the data compression system is applied.

FIG. 13 is an example of an overall configuration of a storage system to which the data compression system and the data decompression system (hereinafter collectively referred to as a data compression and decompression system) according to the above embodiment are applied. In FIG. 13, a storage system 1101 includes a storage controller 1102 that executes data transfer and data processing, and a drive housing (drive box) 1103.

The storage controller 1102 includes a front-end interface (I/F) unit 1111, a CPU 1112, a back-end I/F unit 1114, and a data compression and decompression system 1110 according to the above embodiment. In a configuration example of FIG. 13, the data compression and decompression system 1110 is mounted in the storage controller 1102.

The front-end I/F unit 1111 receives a request to the storage system 1101 from a host computer (not illustrated), and transmits a result of the reception. The CPU 1112 controls the entire storage system 1101. The back-end I/F unit 1114 is connected to the drive housing 1103.

The drive housing 1103 includes a drive I/F unit 1121 connected to the storage controller 1102, solid state drives (SSD) 1122A to 1122G that are nonvolatile semiconductor memory devices, and a housing structure that houses these SSDs. The SSD is an example of a storage device mounted on the drive housing 1103.

Although FIG. 13 illustrates seven SSDs 1122A to 1122G, the number of SSDs is not limited to seven and may be any number. Although FIG. 13 illustrates only one drive I/F unit 1121, two drive I/F units may be mounted, and each of the SSDs 1122A to 1122G including two ports may be connected to each of the two drive I/F units. Further, two or more drive housings 1103 may be provided.

The number of storage controllers 1102 is not limited to one, and may be two or more. The number of each internal component of the storage controller 1102 is not limited to one as illustrated in FIG. 13, and two or more front-end I/F units 1111, two or more CPUs 1112, two or more memories 1113, two or more back-end I/F units 1114, and two or more data compression and decompression systems 1110 may be mounted.

Although FIG. 13 illustrates that the storage controller 1102 and the drive housing 1103 are separated from each other, the storage controller 1102 and the drive housing 1103 may not be separated from each other. In this case, when a plurality of drive housings 1103 are mounted, at most one drive housing 1103 is integrated with the storage controller 1102, and the remaining drive housings 1103 may be connected to the storage controller 1102 in the same form as the configuration illustrated in FIG. 13.

The data compression and decompression system 1110 may acquire, via the CPU 1112, compressed data from the memory 1113, decompress the compressed data, and store plaintext data in the memory 1113. Alternatively, the data compression and decompression system 1110 may directly receive and compress data received from the host computer through the front-end I/F unit 1111 without storing the data in the memory 1113.

The data compression and decompression system 1110 may directly store, through the back-end I/F unit 1114, the compressed data in the SSDs 1122A to 1122G without storing the compressed data in the memory 1113, or directly extract the compressed data from the SSD 1122 and decompress the compressed data without storing the compressed data in the memory 1113. The data compression and decompression system 1110 may directly return the decompressed plaintext data to the host computer through the front-end I/F unit 1111 without storing the decompressed plaintext data in the memory 1113.

Figure 14:
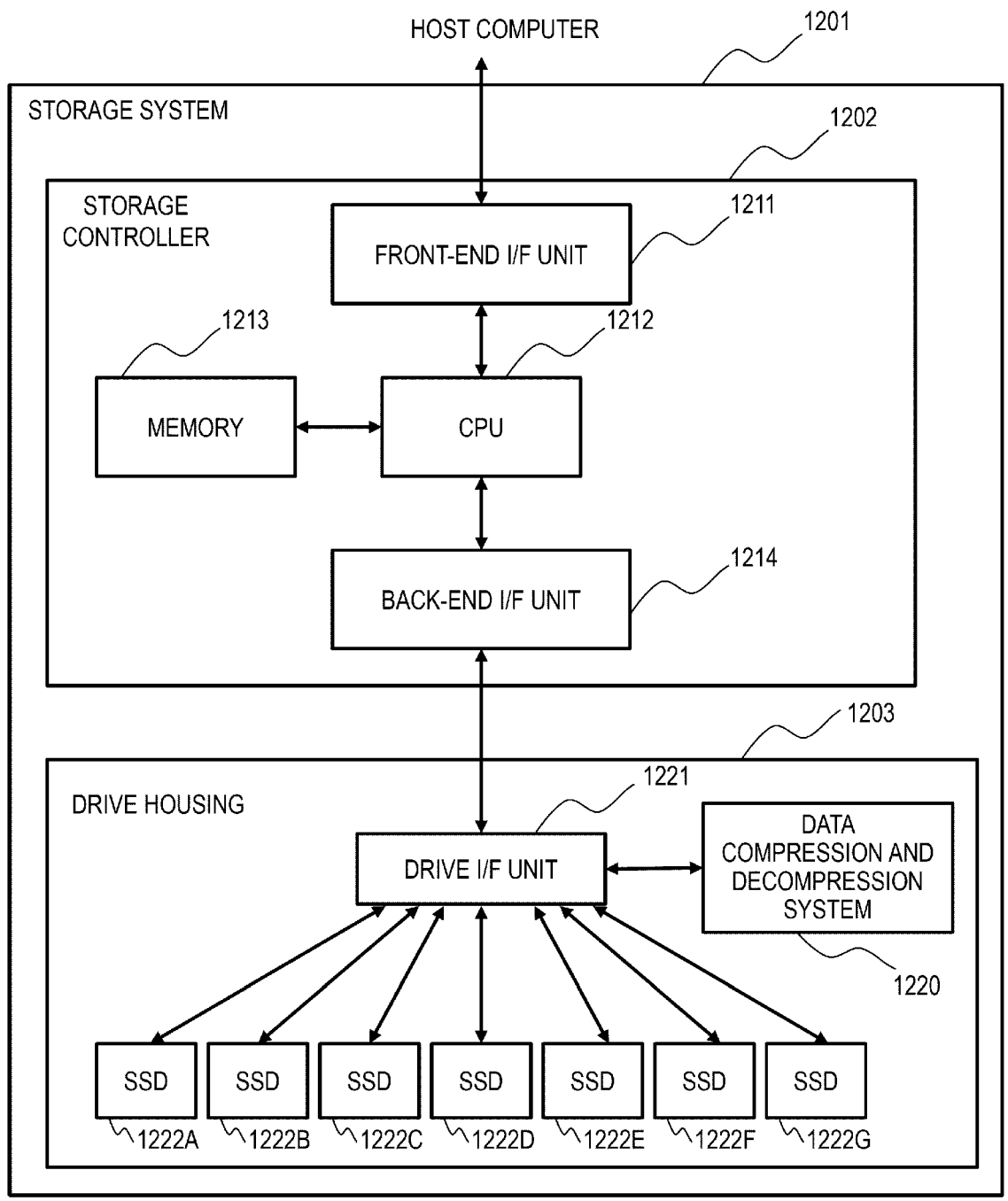
FIG. 14 shows another example of the overall configuration of the storage system to which the data compression system is applied.

FIG. 14 is another example of the overall configuration of the storage system to which the data compression and decompression system according to the above embodiment is applied. In FIG. 14, a data compression and decompression system 1220 is not in a storage controller 1202 but in a drive housing 1203. That is, the storage controller 1202 includes a front-end I/F unit 1211, a CPU 1212, a memory 1213, and a back-end I/F unit 1214. The drive housing 1203 includes a drive I/F unit 1221, the data compression and decompression system 1220, SSDs 1222A to 1222G, and a housing structure that houses these SSDs.

In a configuration shown in FIG. 14, the number of each of the storage controller 1202, the drive housing 1203, the front-end I/F unit 1211, the CPU 1212, the memory 1213, the back-end I/F unit 1214, the drive I/F unit 1221, and the data compression and decompression system 1220 is at most one, and the number of the SSDs 1222A to 1222G is at most seven. However, the number of each of these components is not limited, and may be any number as in the configuration shown in FIG. 13. In addition, the storage controller 1202 and the drive housing 1203 may not be particularly separated from each other, and may be integrated as in the configuration example of FIG. 13.

As shown in FIG. 14, in the configuration in which the data compression and decompression system 1220 is mounted in the drive housing 1203, the data received from the host computer is subjected to predetermined processing in the storage controller 1202, and is then directly transferred to the data compression and decompression system 1220 through the drive I/F unit 1221. The data compression and decompression system 1220 compresses data and then directly stores the compressed data in the SSDs 1222A to 1222G.

When the compressed data stored in the SSDs 1222A to 1222G is to be decompressed, the data compression and decompression system 1220 receives the compressed data from the SSDs 1222A to 1222G without temporarily sending the compressed data from the SSDs 1222A to 1222G to the storage controller 1202. After the data compression and decompression system 1220 decompresses the compressed data, the decompressed data is directly transferred from the data compression and decompression system 1220 to the storage controller 1202 through the drive I/F unit 1221.

The invention is not limited to the above-described embodiments, and includes various modifications. For example, the above-described embodiments are described in detail for easy understanding of the invention, and the invention is not necessarily limited to those including all the configurations described above. A part of a configuration of one embodiment can be replaced with a configuration of another embodiment, and the configuration of another embodiment can be added to the configuration of one embodiment. A part of the configuration of each embodiment may be added, deleted, or replaced with another configuration.

Each of the above configurations, functions, processing units, or the like may be partially or entirely implemented by a hardware such as through design using an integrated circuit. The above configurations, functions, and the like may be implemented by software by means of a processor interpreting and executing a program for implementing respective functions. Information on programs, tables, files or the like for implementing each function can be placed in a recording device such as a memory, a hard disk, and a solid state drive (SSD), or a recording medium such as an IC card, an SD card, or the like.

Further, control lines and information lines show those considered to be necessary for the description, and not all the control lines and the information lines are necessarily shown on the product. In practice, it may be considered that almost all the configurations are connected to each other.

What is claimed is:
1. A storage system comprising:
an interface; and
a data compression system configured to compress reception data from the interface before the data is stored in a storage device, wherein
the data compression system is configured to
compress the reception data using a first compression algorithm to generate first compressed data,
use the number of appearances of each of predetermined code categories included in the first compressed data to estimate a decompression time when a second compression algorithm is used,
select a second compression method including compression using the second compression algorithm when the decompression time is equal to or less than a threshold value, and select a first compression method that does not include the compression using the second compression algorithm when the decompression time is greater than the threshold value.

2. The storage system according to claim 1, wherein the data compression system is configured to
hold information on a decompression processing time of each of the code categories, and
estimate the decompression time based on a product-sum of the decompression processing time and the number of appearances of the code categories.

3. The storage system according to claim 1, wherein the first compression algorithm is a dictionary compression algorithm.

4. The storage system according to claim 3, wherein the code categories include different code categories indicating copy codes having different matching lengths and/or distances.

5. The storage system according to claim 1, wherein the second compression algorithm is an entropy coding algorithm or a Huffman coding algorithm.

6. The storage system according to claim 1, wherein in the first compression method, the first compressed data is output.

7. The storage system according to claim 1, wherein the second compression method includes generation of the first compressed data using the first compression algorithm and compression of the first compressed data using the second compression algorithm.

8. The storage system according to claim 7, wherein when the decompression time is greater than the threshold value, the compression using the second compression algorithm is omitted.

9. The storage system according to claim 1, wherein in the first compression method, the reception data is compressed using a third compression algorithm different from the first compression algorithm and the second compression algorithm.

10. The storage system according to claim 1, further comprising:
a data decompression system, wherein
the data compression system is configured to estimate the decompression time using a predetermined function having a predetermined parameter, and
the data decompression system is configured to
decompress the data compressed using the second compression method to restore the reception data,
measure a decompression time of the data compressed using the second compression algorithm in the restoration of the reception data, and
correct the predetermined parameter based on the measured decompression time.

11. A data processing method in a storage system, comprising:
acquiring reception data from outside;
compressing the reception data using a first compression algorithm to generate first compressed data;
using the number of appearances of each of predetermined code categories included in the first compressed data to estimate a decompression time when a second compression algorithm is used;
selecting a second compression method including compression using the second compression algorithm when the decompression time is equal to or less than a threshold value; and
selecting a first compression method that does not include the compression using the second compression algorithm when the decompression time is greater than the threshold value.

* * * * *